United States Patent
Ochs et al.

(10) Patent No.: US 9,002,038 B2
(45) Date of Patent: Apr. 7, 2015

(54) MEMS MICROPHONE PACKAGE WITH MOLDED INTERCONNECT DEVICE

(71) Applicant: Robert Bosch GmbH, Stuttgart (DE)

(72) Inventors: Eric Ochs, Pittsburgh, PA (US); Jay S. Salmon, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/022,523

(22) Filed: Sep. 10, 2013

(65) Prior Publication Data
US 2014/0072151 A1     Mar. 13, 2014

Related U.S. Application Data

(60) Provisional application No. 61/698,801, filed on Sep. 10, 2012.

(51) Int. Cl.
*H04R 25/00* (2006.01)
*H04R 23/00* (2006.01)
*B81B 7/00* (2006.01)
*H04R 1/04* (2006.01)

(52) U.S. Cl.
CPC .............. *H04R 23/00* (2013.01); *B81B 7/0064* (2013.01); *H04R 1/04* (2013.01); *B81B 2201/0257* (2013.01); *H04R 2201/003* (2013.01)

(58) Field of Classification Search
USPC ......... 381/113, 369, 174, 175, 191, 360, 355, 381/189; 29/25.41, 25.42, 825; 257/433, 257/659, 678, 684, 690; 438/51, 53
See application file for complete search history.

(56) References Cited

U.S. PATENT DOCUMENTS

| | | | |
|---|---|---|---|
| 7,466,834 B2 * | 12/2008 | Ogura et al. | 381/174 |
| 8,049,287 B2 | 11/2011 | Combi et al. | |
| 8,102,015 B2 | 1/2012 | Gong et al. | |
| 8,115,283 B1 | 2/2012 | Bolognia et al. | |
| 8,170,244 B2 | 5/2012 | Ryan et al. | |
| 8,193,596 B2 | 6/2012 | Lee et al. | |
| 8,203,190 B2 | 6/2012 | Goodelle et al. | |

(Continued)

FOREIGN PATENT DOCUMENTS

DE    102008007682    12/2008
WO    2012/004339    1/2012

OTHER PUBLICATIONS

International Search Report for Application No. PCT/US2013/058891 dated Nov. 14, 2013 (5 pages).

*Primary Examiner* — Huyen D Le
(74) *Attorney, Agent, or Firm* — Michael Best & Friedrich LLP (57) ABSTRACT

A microphone package is described that includes a plastic lid, a substrate base, and two electrical components. The plastic lid includes a first conductive lid trace and the substrate base includes a first conductive substrate trace. The plastic lid is sealably coupled to the substrate base to form a sealed cavity. The substrate trace and the lid trace are arranged such that, when the cavity is sealed, an electrical connection is formed between the substrate trace and the lid trace. The first component is mounted on the substrate base and electrically coupled to the substrate trace. The second component is mounted on the lid and is electrically coupled to the lid trace. The electrical connection between the substrate trace and the lid trace provides electrical coupling between the first component and the second component. At least one of the first component and the second component includes a MEMS microphone die.

20 Claims, 7 Drawing Sheets

(56) References Cited

U.S. PATENT DOCUMENTS

| | | | |
|---|---|---|---|
| 2008/0298621 A1* | 12/2008 | Theuss et al. | 381/360 |
| 2010/0086146 A1 | 4/2010 | Gong et al. | |
| 2011/0180885 A1 | 7/2011 | Pahl et al. | |
| 2011/0298064 A1 | 12/2011 | Pahl et al. | |
| 2012/0153771 A1 | 6/2012 | Formosa et al. | |

\* cited by examiner

MEMS MICROPHONE PACKAGE WITH MOLDED INTERCONNECT DEVICE

RELATED APPLICATIONS

This application claims the benefit of U.S. Provisional Patent Application No. 61/698,801, filed on Sep. 10, 2013 and entitled "MEMS MICROPHONE PACKAGE WITH MOLDED INTERCONNECT DEVICE," the entire contents of which are incorporated herein by reference.

BACKGROUND

The present invention relates to a MEMS microphone package. In particular, the invention relates to mechanisms for electronic communication between components within a MEMS microphone package.

SUMMARY

In one embodiment, the invention provides a microphone package including a plastic lid, a substrate base, and two electrical components. The plastic lid includes a first conductive lid trace and the substrate base includes a first conductive substrate trace. The plastic lid is sealably coupled to the substrate base to form a sealed cavity. The substrate trace and the lid trace are arranged such that, when the cavity is sealed, an electrical connection is formed between the substrate trace and the lid trace. The first component is mounted on the substrate base and electrically coupled to the substrate trace. The second component is mounted on the lid and is electrically coupled to the lid trace. The electrical connection between the substrate trace and the lid trace provides electrical coupling between the first component and the second component. At least one of the first component and the second component includes a MEMS microphone die.

In another embodiment, the invention provides a top-ported microphone package including a molded interconnect device lid, a base substrate, a MEMS microphone die, and an electrical contact pad. The MEMS microphone die is mounted on the molded interconnect device lid adjacent to an acoustic port opening that extends through the lid. The MEMS microphone die is electrically coupled to a conductive trace on the interior surface of the lid. The electrical contact pad is mounted on an exterior surface of the substrate base and is electrically coupled to a conductive substrate trace. The conductive substrate trace and the lid trace are arranged to form an electrical connection to provide for electrical coupling between the MEMS microphone die and the electrical contact pad.

In yet another embodiment, the invention provides a bottom-ported microphone package that includes a molded interconnect device lid, a base substrate, a MEMS microphone die, and an electrical contact pad. The MEMS microphone die is mounted on the base substrate adjacent to an acoustic port opening that extends through the base substrate. The MEMS microphone die is electrically coupled to a conductive trace on an interior surface of the base substrate. The electrical contact pad is mounted on an exterior surface of the lid and is electrically coupled to a conductive trace on an interior surface of the lid. The conductive substrate trace and the lid trace are arranged to form an electrical connection to provide for electrical coupling between the MEMS microphone die and the electrical contact pad.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Acoustic performance of a microphone requires an acoustic chamber and an open port into the chamber to receive sound input. Depending upon the particular application, original equipment manufacturers (OEMs) that utilize microelectromechanical microphones (MEMS microphones) require MEMS microphone in both bottom-port and top-port configurations. In a bottom-port configuration, the acoustic input port is on the bottom of the microphone package while, in a top-port configuration, the acoustic input port is located on the top of the microphone package. Some bottom-port microphone packages include an acoustic input port formed as a hole through the substrate with the MEMS microphone die placed above the hole. A lid is then placed over the substrate to form an enclosed cavity.

To obtain equivalent performance in a top-port microphone package, the acoustic input port can be formed as a hole through the lid with a MEMS microphone die placed directly underneath the hole. However, in such constructions, mechanisms must be provided for electronic communication between the top surface of a microphone package (i.e., the lid) and the bottom surface of the microphone package (i.e., the substrate). One option would be to construct the MEMS microphone package as a stack of laminate substrates with a cavity formed by the inner substrate. Electronic routing between the top surface and the bottom surface can be accomplished by vias positioned in the sidewalls of the inner substrate. Alternatively, "flip-chip" design technology could be used to place the MEMS microphone die on the substrate upside-down. An additional sealing to the lid of the microphone package would then be required to ensure proper acoustic performance.

Figure 1A:
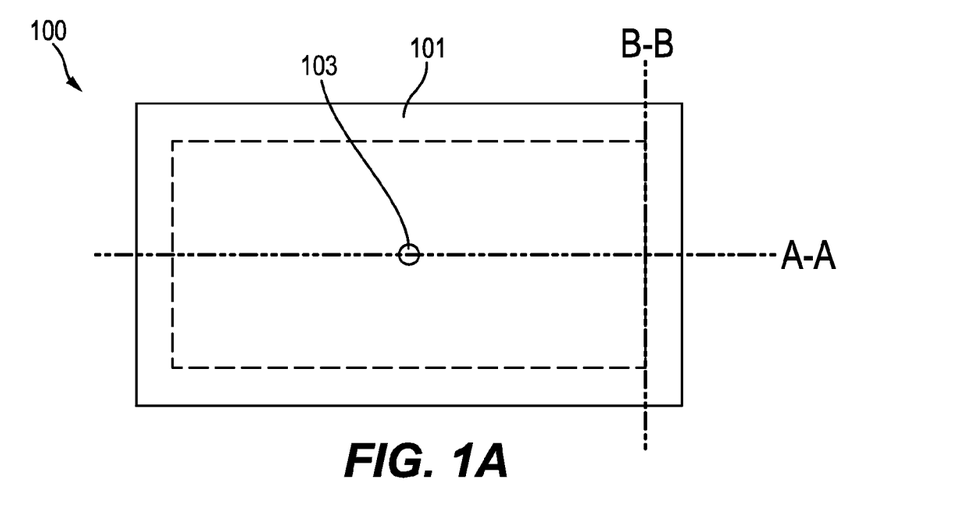
FIG. 1A is a top view of a top-ported MEMS microphone package.
Figure 1B:
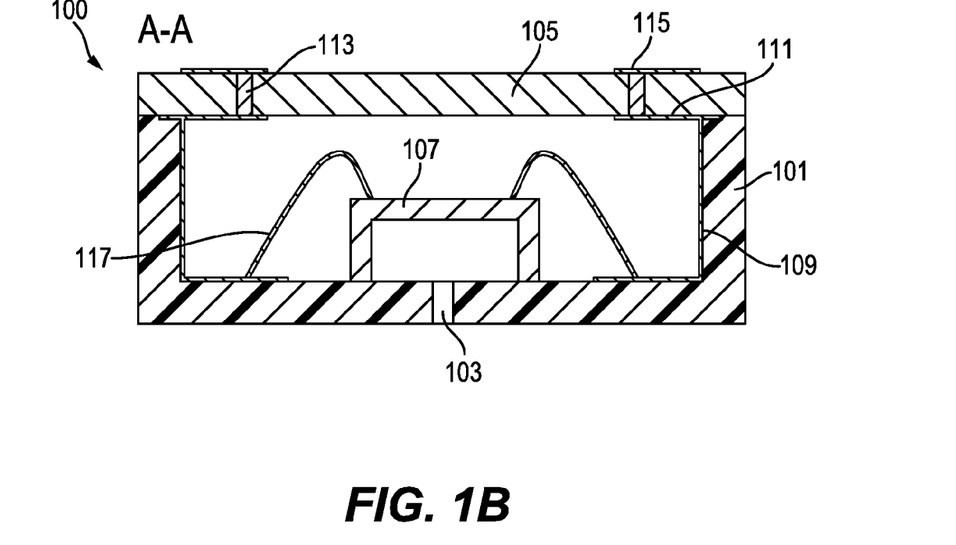
FIG. 1B is a cross-sectional elevation view of the top-ported MEMS microphone package of FIG. 1A from a first perspective.
Figure 1C:
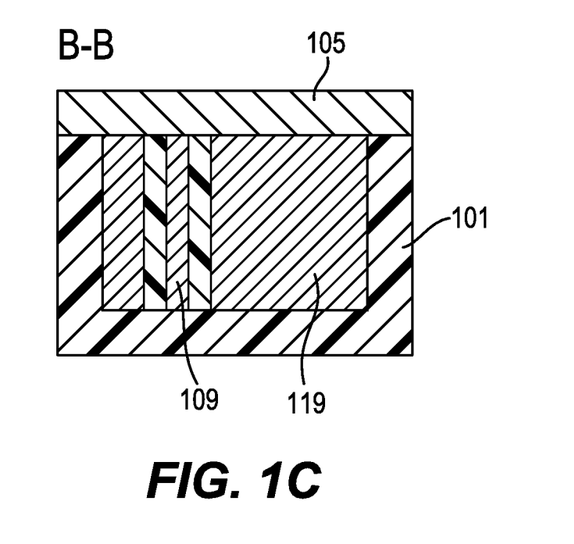
FIG. 1C is another cross-sectional elevation view of the top-ported MEMS microphone package of FIG. 1A from a second perspective.

FIGS. 1A-1C illustrate an example of a top-ported MEMS microphone package that provides for communication between the top surface (i.e., the lid) and the bottom surface (i.e., the substrate) of a microphone using a lid that operates as a molded interconnect device (MID). FIG. 1A shows the top surface of the package 100. From this perspective, the lid component 101 is visible as well as the acoustic input port 103 formed through the lid 101. The lid 101 is an injection-molded thermoplastic component with integrated electronic circuit traces as described in further detail below.

FIG. 1B provides a cross-sectional view of the microphone package 100 along the A-A line of FIG. 1A. It is noted that, although FIGS. 1A-1C illustrate a top-ported microphone package, FIG. 1B shows the microphone package 100 oriented with the acoustic port 103 on the bottom of the package 100. As illustrated in FIG. 1B, the thermoplastic lid 101 is formed with a hollow cavity inside. The thermoplastic lid 101 is coupled to a substrate layer 105 to form a sealed cavity. A MEMS microphone die 107 is mounted to the lid 101 adjacent to the acoustic port opening 103 such that acoustic pressures (e.g., sounds) entering the microphone package 100 through the acoustic input port 103 encounter the MEMS microphone die 107.

Conductive traces 109 (e.g., metal) are deposited on the interior surface of the MID lid 101. When the substrate 105 is sealed to the lid 101, the conductive traces are electronically coupled with corresponding traces formed on the substrate 105. In the example of FIG. 1B, the circuit traces 111 on the substrate 105 are coupled to one or more electric vias 113 which, in turn, are coupled to one or more electrical contact pads 115 on the bottom surface of the substrate 105.

In the example of FIG. 1B, the MEMS microphone die 107 is a monolithically integrate MEMS die which includes both application specific integrated circuit (ASIC) components and the micro-mechanical electric microphone diaphragm within a single die. Wires 117 extend from the MEMS microphone die 107 to couple the MEMS microphone die 107 to the conductive traces 109 on the interior surface of the lid 101. As such, the MEMS microphone die 107 is in electronic communication with one or more devices mounted on the substrate 105—including, in this example, the electric contact pads 115 on the exterior surface of the microphone package 100.

FIG. 1C provides another cross-sectional view of the microphone package—this time along the B-B line of FIG. 1A. FIG. 1C provides a more detail view of the interior surface of the lid 101. As noted above, conductive traces 109 deposited on the interior walls of the lid 101 provide for electrical routing between the lid 101 and the substrate 105. However, in this example, interior surfaces of the lid 101 that are not used for electrical routing are covered with a conductive layer 119 that is grounded to the substrate. The lined surfaces 119 of the cavity, together with the substrate 105 (which may also include a conductive ground plate) forms a Faraday's cage and provide for improved electromagnetic shielding of the MEMS microphone device.

Figure 2:
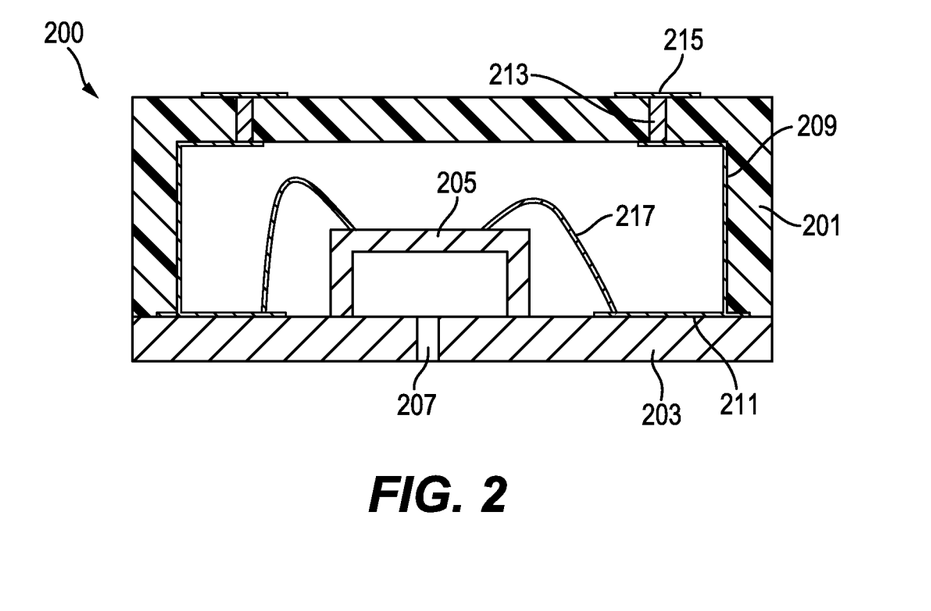
FIG. 2 is a cross-sectional elevation view of a bottom-ported MEMS microphone package.

The examples discussed above in reference to FIGS. 1A-1C illustrate a top-ported microphone package that provides for electrical communication between the substrate 105 and devices (such as a MEMS microphone die 107) mounted on the top surface of the lid. FIG. 2 illustrates an example of a bottom-ported microphone package that also provides for electrical communication between the top surface of the microphone package and the bottom surface. The microphone package 200 of FIG. 2 includes a thermoplastic lid 201 sealably coupled to a substrate 203. Because the microphone package 200 is a bottom-ported configuration, the MEMS microphone die 205 is mounted on the substrate 203 adjacent to an acoustic input port 207 formed through the substrate 205.

Like the example of FIGS. 1A-1C, conductive metal traces 209 are deposited on the interior surface of the lid 201. The conductive traces 209 on the lid 201 align with corresponding traces 211 on the substrate and extend to a conductive "via" 213 formed through the top surface of the lid 201. One or more electrical contact pads 215 are mounted on the exterior of the top surface of the lid 201. When the MEMS microphone die 205 is coupled to the conductive traces 211 on the substrate 203 by one or more wires 217, the conductive traces 209 on the interior surface of the lid 201 couple the MEMS microphone die 205 to the electrical contact pads 215 on the exterior top surface of the lid 201.

Figure 3A:
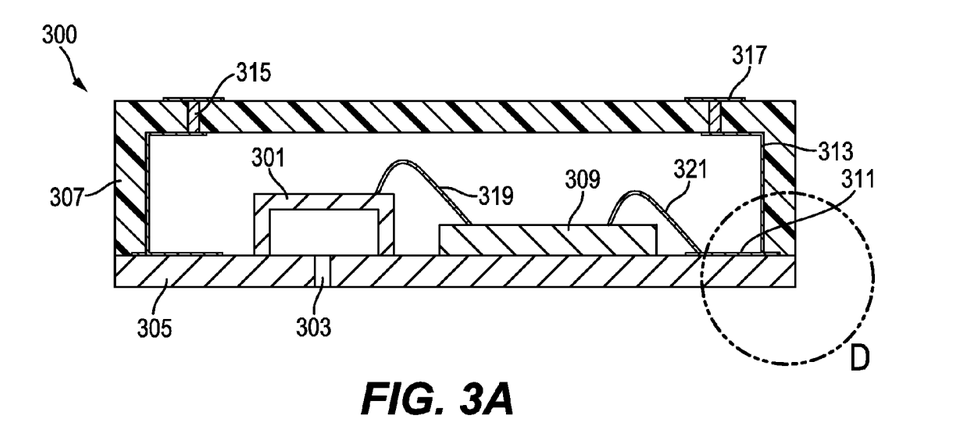
FIG. 3A is a cross-sectional elevation view of a second example of bottom-ported MEMS microphone package.

FIG. 3A illustrates yet another example of a bottom-ported microphone package 300. In this example, the MEMS microphone die 301 is again mounted adjacent to an acoustic input port 303 formed through the substrate 305. The substrate 305 is sealably coupled to a thermoplastic molded lid 307. However, in this example, additional electronic components—i.e., an ASIC 309—is also mounted to the substrate 305. The conductive traces 311 on the substrate align with the corresponding conductive traces 313 on the interior surface of the lid 307 and extend to a conductive "via" 315 formed through the top surface of the lid. One or more electrical contact pads 317 are mounted on the exterior of the top surface of the lid 307. A first wire bond electronically couples the MEMS microphone die 301 to the ASIC 309 while a second wire bond 321 couples the ASIC 309 to the contact pad 317 on the exterior surface of the lid 307 through the traces 313 deposited on the interior surface of the lid 307. In this way, the ASIC 309 monitors and controls the operation of the MEMS microphone die 301 and also facilitates electrical communication with exterior systems through the contact pads 317.

Figure 3B:
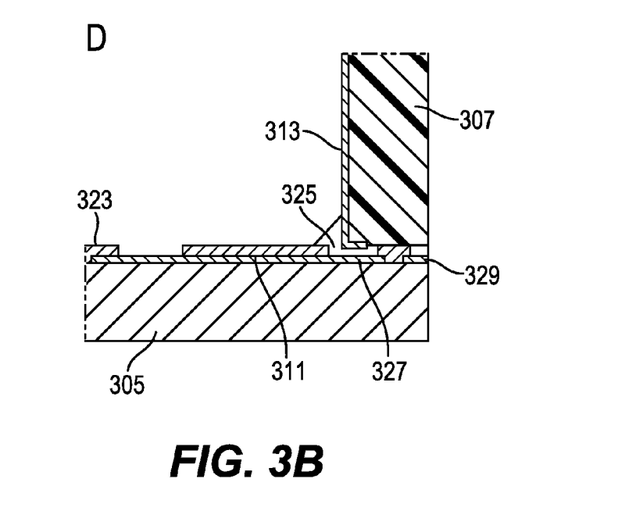
FIG. 3B is a detailed view of the bottom-ported MEMS microphone package of FIG. 3A.

FIG. 3B illustrates additional features of the bottom-ported configuration of FIG. 3A by providing a detailed view of inset "D" from FIG. 3A. As shown in FIG. 3B, an isolating layer 323 provides a solder mask with openings 325 where conductive traces 313 on the lid 307 can be electronically coupled with traces 311 on the substrate 305. When solder (or another conductive material) is deposited at 325 to seal the lid 307 to the substrate 305, an electrical connection 327 is formed between the lid traces 313 and the corresponding substrate traces 311.

Figure 3C:
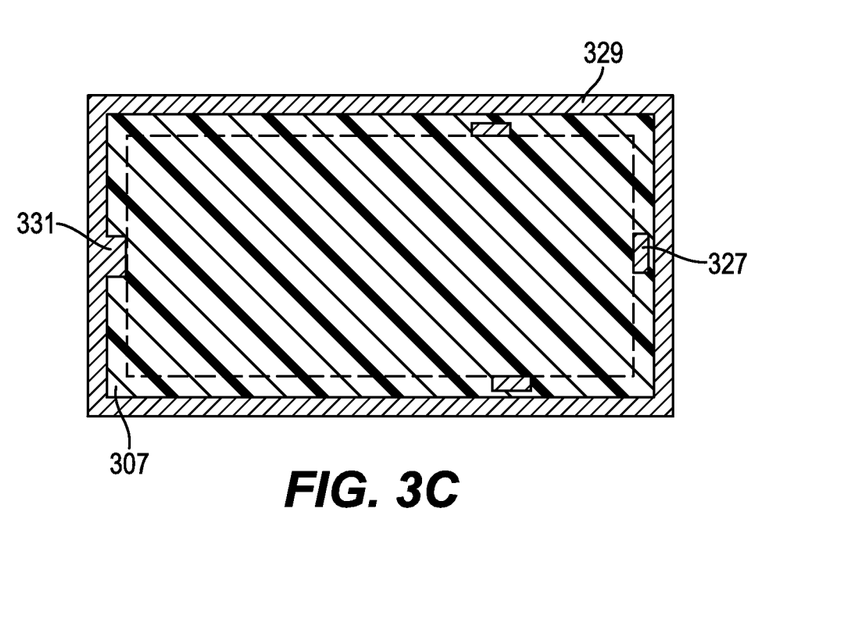
FIG. 3C is a bottom-up cross-sectional view of the bottom-ported MEMS microphone package of FIG. 3A.

As shown in FIG. 3B, an electrically isolated trace 329 forms a conductive ring around the outer edge of the substrate that is used to acoustically seal the cavity and to also provide a conductive connection between a conductive shielding layer on the lid 307 to the grounding of the substrate 305. This conductive ring and the shielding arrangement is more clearly illustrated in FIGS. 3C and 3D. FIG. 3C shows a cross-section of the lid 307 from the bottom at the point where the lid 307 is coupled to the substrate 305. The dotted line represents the interior surface of the lid 307 where the electronic traces are deposited for electronic communication. A conductive shielding layer extends through the lid above the conductive trace ring 329. The conductive shielding layer can be formed on the interior surface of the lid 307 as illustrated in FIG. 1C above or can be deposited on the exterior surface of the molded lid 307. Electrical communication between the active electronics and the conductive traces of the lid is provide at point 327 whereas ground of the shielding is provided at contact pad 331.

Figure 3D:
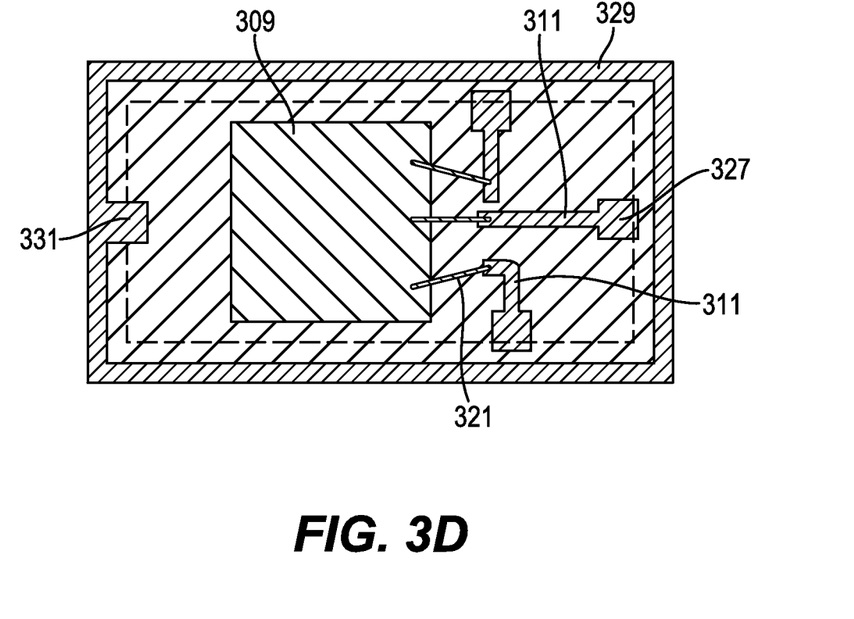
FIG. 3D is a top-down cross-sectional view of the bottom-ported MEMS microphone package of FIG. 3A.

FIG. 3D shows the corresponding conductive contact arrangement on the substrate 305. Again, the conductive ring trace 329 provides electrical coupling between the shielding layer of the lid 307 and the grounding of the substrate 305 at contact pad 331. The conductive traces 311 on the surface of the substrate 305 are more visible in FIG. 3D and align with the traces on the interior surface of the lid 307 at electrical connection 327. Wire bonds 321 connect the ASIC 309 to the electrical traces 311 of the substrate 305.

Although the discussion above focuses primarily on a single path of electronic communication between the components mounted on the substrate and components mounted on the opposite surface of the lid, it is to be understood that the concepts discussed above can be used to provide multiple avenues for electronic communication between the two surface and, in some cases, between the substrate and devices mounted on the side surfaces of the lid. For example, in FIG. 3D, a total of three wire bonds 321 are each used to connect the ASIC 309 to a different trace 311. Each trace extends to a point where it contacts the lid—and the corresponding traces formed on the interior of the lid—at a different location. As such, the example of FIG. 3D provides for three different, electrically isolated paths for electrical communication between the ASIC 309 mounted on the substrate 305 and components (e.g., electrical contact pads) mounted on the top surface of the lid.

Figure 4:
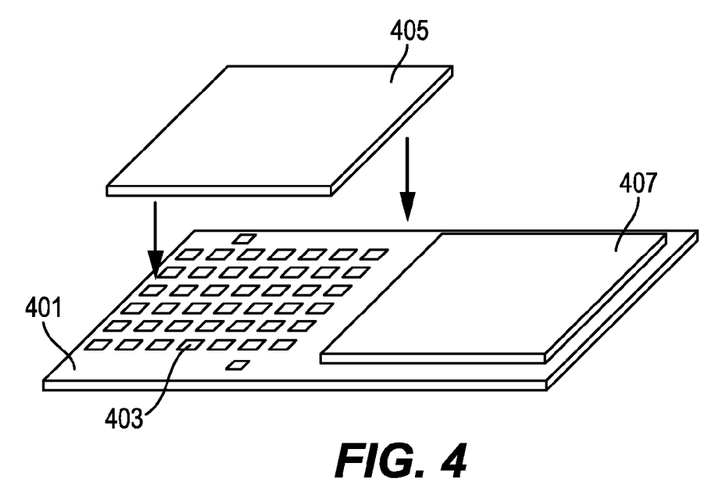
FIG. 4 is a perspective view of an array of MEMS microphone package during assembly.

MEMS microphone packages such as those described above can be manufactured in arrays and singulated from a single substrate. As illustrated in FIG. 4, a single substrate layer 401 is manufactured to include a plurality of MEMS microphone dies, associated circuitry, and necessary conductive traces (collectives shown as 403) arranged in an array. An array 405 of thermoplastic molded lids—each with the appropriate conductive traces—is aligned with the array of substrate packages 403, lowered into place, and sealably coupled to the substrate. FIG. 4 shows a first array of lids 405 aligned above the substrate array 401 and another array of lids 407 lowered into place. The individual packages are then singulated from the array.

Some constructions of the MEMS microphone package are specifically designed to benefit from the array-based manufacturing technique and the singulation process such as described above. For example, instead of metalizing the interior surface of the lid for shielding purposes, one or more metalized electric vias can be formed as part of the lid array positioned along the saw-street of the array.

Figure 5A:
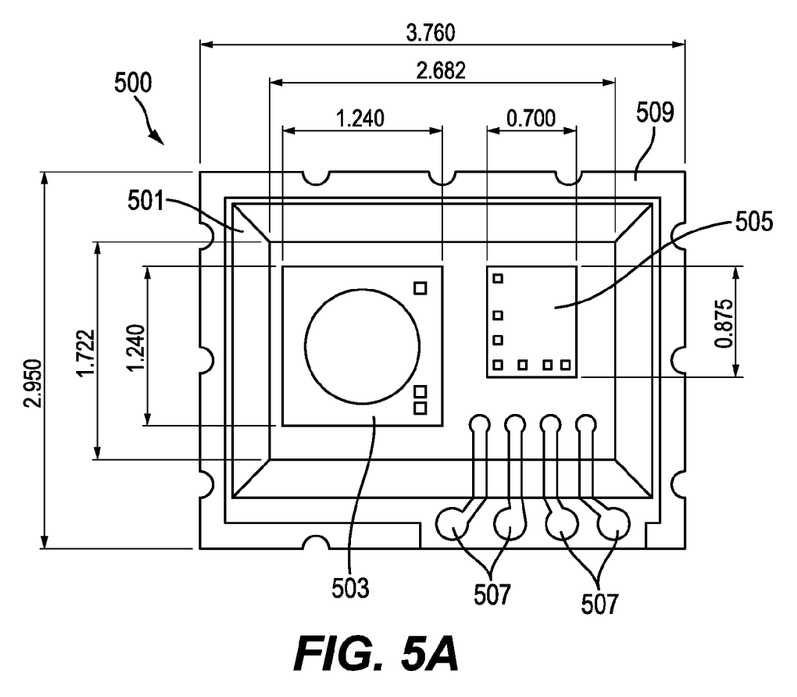
FIG. 5A is a bottom-up cross-sectional view of a third example of a bottom-ported MEMS microphone package.

FIG. 5A illustrates an example of one such construction of a top-ported MEMS microphone package 500 (the substrate is omitted to better illustrate the arrangement and component of the lid of the package). The reference measurements provide the relative dimensions of the components in this example. A lid 501 is provides with both a MEMS microphone die 503 and an ASIC 505 mounted thereto. A series of conductive traces 507 are positioned within the material of the lid 501 and provide for electrical connection with the substrate when the cavity is sealed. As noted above, a conductive layer 509 is positioned around the exterior surface of the lid 501. This conductive layer 509 is coupled to the grounding of the substrate and provides for electromagnetic shielding of the MEMS microphone die 503 as discussed above.

The conductive layer 509 in this example is not deposited on the exterior surface of the lid 501. Instead, the array of lids (i.e., array 405 of FIG. 4) is manufactured to includes one or more vias arranges along the saw-streets of the array of lids. When the individual packages are singulated from the array, the vias are partially cut away. The remaining portion of the conductive via on the exterior surface of the lid forms the conductive shielding layer 509 of FIG. 5A.

Figure 5B:
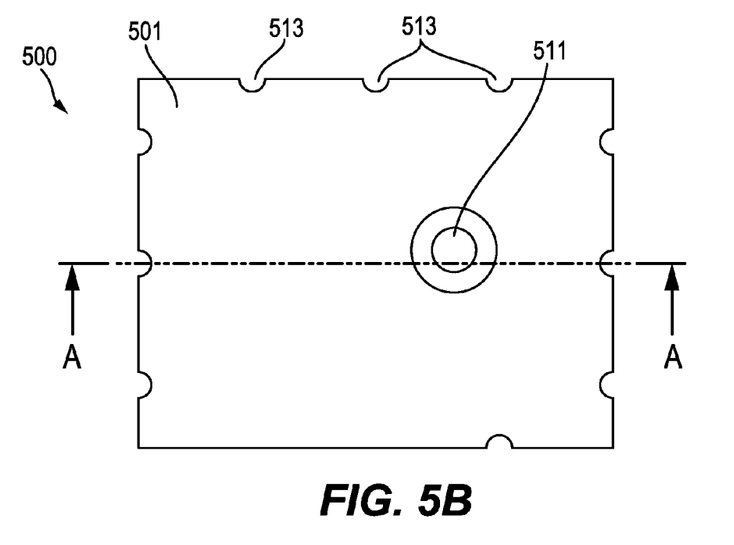
FIG. 5B is a bottom-up view of the bottom surface of the bottom-ported MEMS microphone package of FIG. 5A.
Figure 5C:
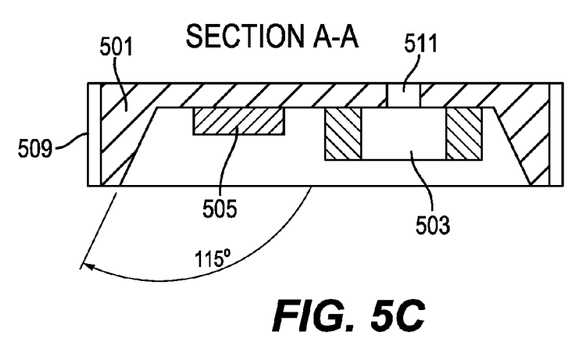
FIG. 5C is a cross-sectional elevation view of the bottom-ported MEMS microphone package of FIG. 5A.

FIG. 5B shows the top exterior surface of the lid 501 of the top-ported microphone package 500. The acoustic port opening 511 is visible through the top surface of the lid 500. As shown in FIG. 5C, the MEMS microphone die 503 is mounted to the lid 501 adjacent to the acoustic port opening 511. The ASIC 505 is also mounted to the surface of the lid. As noted above, the conductive shielding layer 509 extends along the exterior surface of each singulated package 500.

Alternatively, instead of utilizing vias placed at the saw-street of the array to form a substantially uniform conductive layer on the exterior surface of the lid, cylindrical conductive vias can be positioned at periodic intervals along the saw-street in the array. When the individual microphone packages 500 are singulated, the cylindrical vias are halved. The remaining portion—illustrated in FIG. 5B as the semicircular structures 513—are coupled to the substrate grounding and provide shielding for the microphone device.

Figure 5D:
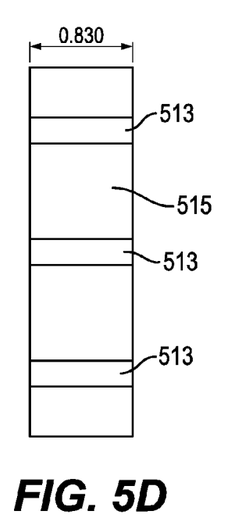
FIG. 5D is a side view of the bottom-ported MEMS microphone package of FIG. 5A.
Figure 5E:
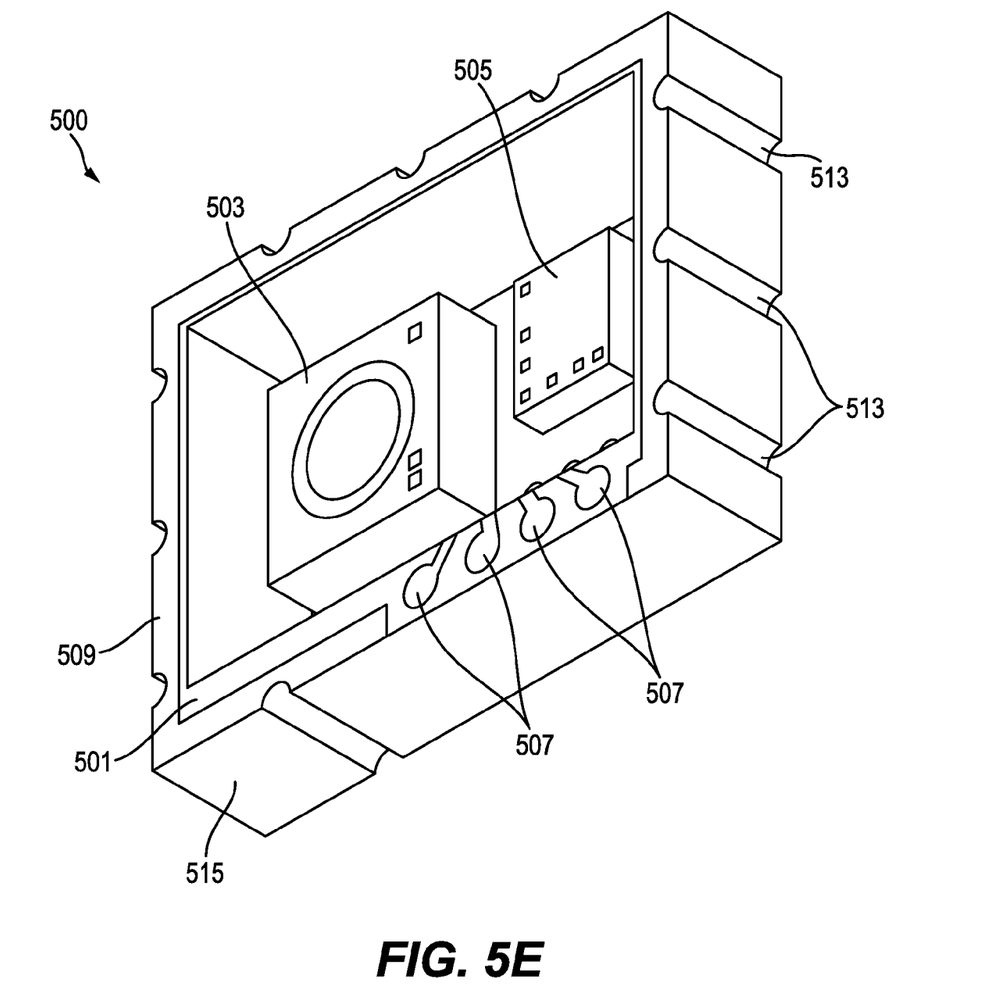
FIG. 5E is a perspective view of the bottom-ported MEMS microphone package of FIG. 5A.

In yet another construction, an isolating layer 515 is deposited on the exterior surface of the conductive shielding layer 509 after the microphone packages are singulated. To provide for electrical contact points to the shielding layer 509, semi-cylindrical cut-outs 513 are formed at intervals around the perimeter of the lid 501. As shown in FIG. 5D, the cylindrical cutouts 513 cut through the isolating layer 515 so that the conductive shielding layer 5009 is partially exposed on the exterior of the microphone package. The layout and construction of the package 500 is also illustrated in perspective view in FIG. 5E.

The specific layouts, components, and manufacturing techniques described above are exemplary and are capable of different implementations. For example, in addition to using an injection moldable thermoplastic material to form the MID lid, transfer moldable thermosetting plastic materials can be used. Although this material is not typically used for MID technology, it may be implemented in some microphone package constructions by utilizing plating methods for metallization.

Thus, the invention provides, among other things, a MEMS microphone package including a substrate and a molded lid that provides for electrical coupling between one or more components mounted on a substrate and one or more components mounted on the lid. Various features and advantages of the invention are set forth in the following claims.

What is claimed is:
1. A microphone package comprising:
a plastic lid including
a first conductive lid trace; extending along an interior surface of the plastic lid and
an electrical shielding, whereon the electrical shielding does not overlap with the first conductive lid trace;
a substrate base coupled to the plastic lid to form a sealed cavity, the substrate base including a first conductive substrate trace arranged to form an electrical connection with the first conductive lid trace;
a first component mounted on the substrate base and electrically coupled to the first conductive substrate trace; and
a second component mounted on the plastic lid and electrically coupled to the first conductive lid trace such that the electrical connection between the first conductive lid trace and the first conductive substrate trace provides electrical coupling between the first component and the second component, wherein the first conductive lid trace extends along the interior surface of the sealed cavity from a first location proximal to the second component to a second location that forms the electrical connection with the first conductive substrate trace, and wherein at least one component of a group consisting of the first component and the second component includes a MEMS microphone die positioned in an interior of the sealed cavity.

2. The microphone package of claim 1, further comprising an acoustic input port formed through a surface of the lid, and wherein the second component includes the MEMS microphone die and is mounted on an interior surface of the lid adjacent to the acoustic input port.

3. The microphone package of claim 2, wherein the first component includes an electrical contact pad and is mounted on an exterior surface of the substrate base, and further comprising a conductive via formed through the substrate base electrically coupling the electrical contact pad to the first conductive substrate trace to provide electrical coupling between the electrical contact pad and the MEMS microphone die.

4. The microphone package of claim 2, wherein the first component includes an ASIC mounted on an interior surface of the substrate base, and wherein the electrical connection between the first conductive lid trace and the first conductive substrate trace provides electrical coupling between the MEMS microphone die and the ASIC.

5. The microphone package of claim 1, further comprising an acoustic input port formed through the substrate base, and wherein the first component includes the MEMS microphone die and is mounted on an interior surface of the substrate base adjacent to the acoustic input port.

6. The microphone package of claim 5, wherein the second component includes an electrical contact pad and is mounted on an exterior surface of the lid, and further comprising a conductive via formed through the lid electrically coupling the electrical contact pad to the first conductive substrate trace to provide electrical coupling between the electrical contact pad and the MEMS microphone die.

7. The microphone package of claim 1, wherein the electrical shielding is electrically coupled to a grounding of the substrate base.

8. The microphone package of claim 1, further comprising a plurality of conductive vias arranged on the exterior surface of the lid, wherein each conductive via of the plurality of conductive vias is electrically coupled to a ground of the substrate base to provide electromagnetic shielding for the MEMS microphone die.

9. The microphone package of claim 1, further comprising a second conductive lid trace formed on the interior surface of the lid;
a third component mounted on the lid and electrically coupled to the second conductive lid trace;
a second conductive substrate trace formed on the substrate and arranged to form an electrical connection with the second conductive lid trace; and
a fourth component mounted on the substrate and electrically coupled to the second conductive substrate trace such that the electrical connection between the second conductive lid trace and the second conductive substrate trace provides electrical coupling between the third component and the fourth component.

10. The microphone package of claim 9, wherein the second component includes a first contact pin of the MEMS microphone die and the third component includes a second contact pin of the MEMS microphone die.

11. The microphone package of claim 10, wherein the first component includes a first electrical contact pad mounted on the exterior surface of the substrate base and the fourth component includes a second electrical contact pad mounted on the exterior surface of the substrate base, and further comprising
a first conductive via formed through the substrate base electrically coupling the first electrical contact pad to the first conductive substrate trace to provide electrical coupling between the first electrical contact pad and the first contact pin of the MEMS microphone die; and
a second conductive via formed through the substrate base electrically coupling the second electrical contact pad to the second conductive substrate trace to provide electrical coupling between the second electrical contact pad and the second contact pin of the MEMS microphone die.

12. A method of manufacturing the microphone package of claim 1, the method comprising:
providing a substrate array including a plurality of substrate bases arranged in an array, each substrate base of the plurality of substrate bases including a first conductive substrate trace and a first component electrically coupled to the first conductive substrate trace;
providing a lid array including a plurality of lids arranged in an array, each lid of the plurality of lids including an unsealed cavity, a first conductive lid trace on an interior surface of the unsealed cavity, and a second component electrically coupled to the first conductive lid trace;
aligning the lid array with the substrate array such that each first conductive lid trace aligns with a corresponding first conductive substrate trace;
sealably coupling the substrate array and the lid array to form an array of microphone packages each including a sealed cavity and to electrically connect each first conductive lid trace with the corresponding first conductive substrate trace; and
separating a microphone package from the array of microphone packages by separating the array of microphone packages along a saw-street.

13. The method of claim 12, wherein providing the lid array further includes providing the lid array including a plurality of conductive vias arranged along the saw street.

14. The method of claim 13, further comprising electrically coupling each conductive via of the plurality of conductive vias to a grounding of a corresponding substrate base such that, after the microphone package is separated from the array of microphone packages a subset of conductive vias arranged vertically around the perimeter of the microphone package provide electromagnetic shielding for the MEMS microphone die.

15. The method of claim 13, wherein each first conductive lid trace includes at least a portion of one of the plurality of conductive vias.

16. The method of claim 13, wherein separating the microphone package from the array of microphone packages further includes separating each conductive via of the plurality of conductive vias into two semi-cylindrical conductive vias each arranged vertically along the perimeter of a different microphone package in the array of microphone packages.

17. The microphone package of claim 1, wherein the plastic lid includes a metal layer deposited on the interior surface of the plastic lid, wherein the first conductive lid trace includes a portion of the metal layer that has been physically separated and electrically isolated from a remaining portion of the metal layer, and wherein the electrical shielding includes the remaining portion of the metal layer.

18. The microphone package of claim 1, wherein the plastic lid includes a base and four walls extending from the base to form a hollow cavity, wherein the first location of the first conductive lid trace is positioned on an interior surface of the base, wherein the second location of the first conductive is positioned on an edge of a first wall of the four walls, and wherein the first conductive lid trace extends along at least portion of the interior surface of the base and at least a portion of the interior surface of the first wall.

19. A top-ported microphone package comprising:
- a molded interconnect device lid formed of moldable thermoplastic material and including
    - a conductive lid trace extending along an interior surface of the plastic lid and
    - an electrical shielding, wherein the electrical shielding does not overlap with the first conductive lid trace;
- an acoustic port opening formed through a top surface of the moldable interconnect device lid;
- a MEMS microphone die mounted on an interior surface of the moldable interconnect device lid adjacent to the acoustic port opening, the MEMS microphone die being electrically coupled to the conductive lid trace;
- a base substrate coupled to the moldable interconnect device lid to form a sealed cavity, the base substrate including a conductive substrate trace on the interior of the sealed cavity arranged to form an electrical connection with the conductive lid trace; and
- an electrical contact pad mounted on an exterior surface of the base substrate and electrically coupled to the conductive substrate trace such that the electrical connection between the conductive substrate trace and the conductive lid trace provides electrical coupling between the electrical contact pad and the MEMS microphone die,
    - wherein the first conductive lid trace extends along the interior surface of the sealed cavity from a first location proximal to the second component to a second location that forms the electrical connection with the first conductive substrate trace.

20. A bottom-ported microphone package comprising:
- a base substrate including a conductive substrate trace on a first surface of the base substrate;
- an acoustic port opening formed through the base substrate;
- a MEMS microphone die mounted on the first surface of the base substrate adjacent to the acoustic port opening, the MEMS microphone die being electrically coupled to the conductive substrate trace;
- a molded interconnect device lid formed of moldable thermoplastic material and being coupled to the base substrate to form a sealed cavity, the first surface of the base substrate being on the interior of the sealed cavity, the moldable interconnect device lid including a conductive lid trace arranged to form an electrical connection with the conductive substrate trace,
    - wherein the molded interconnect device lid includes an electrical shielding that does not overlap with the conductive lid trace; and
- an electrical contact pad mount on an exterior surface of the moldable interconnect device lid and electrically coupled to the conductive lid trace such that the electrical connection between the conductive substrate trace and the conductive lid trace provides electrical coupling between the electrical contact pad and the MEMS microphone die,
    - wherein the conductive lid trace extends along an interior surface of the moldable interconnect device lid from a first location proximal to the electrical connection pad to a second location that forms the electrical connection between the conductive substrate trace and the conductive lid trace.

* * * * *